US012607942B2

(12) United States Patent
Theeuwes et al.

(10) Patent No.: US 12,607,942 B2
(45) Date of Patent: Apr. 21, 2026

(54) METROLOGY METHODS AND APPARATUSES FOR LITHOGRAPHIC PERFORMANCE PARAMETER EVALUATION USING PROBABILITY DESCRIPTIONS

(71) Applicant: ASML NETHERLANDS B.V., Veldhoven (NL)

(72) Inventors: Thomas Theeuwes, Veldhoven (NL); Jochem Sebastiaan Wildenberg, Aarle-Rixtel (NL); Lei Zhang, Eindhoven (NL); Ronald Van Ittersum, Tilburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 352 days.

(21) Appl. No.: 18/270,644

(22) PCT Filed: Dec. 23, 2021

(86) PCT No.: PCT/EP2021/087611
§ 371 (c)(1),
(2) Date: Jun. 30, 2023

(87) PCT Pub. No.: WO2022/161726
PCT Pub. Date: Aug. 4, 2022

(65) Prior Publication Data
US 2024/0061346 A1 Feb. 22, 2024

(30) Foreign Application Priority Data
Jan. 29, 2021 (EP) ..................................... 21154358

(51) Int. Cl.
*G03F 7/00* (2006.01)

(52) U.S. Cl.
CPC .. *G03F 7/706837* (2023.05); *G03F 7/706839* (2023.05)

(58) Field of Classification Search
USPC ......................................................... 700/121
See application file for complete search history.

(56) References Cited

U.S. PATENT DOCUMENTS 9,093,458 B2 7/2015 Amir et al.
11,803,127 B2 10/2023 Lin et al.
(Continued)

FOREIGN PATENT DOCUMENTS

EP 3321737 5/2018
EP 3712817 9/2020
(Continued)

OTHER PUBLICATIONS

International Search Report and Written Opinion issued in corresponding PCT Patent Application No. PCT/EP2021/087611 dated Mar. 28, 2022.
(Continued)

*Primary Examiner* — Md Azad
(74) *Attorney, Agent, or Firm* — Pillsbury Winthrop Shaw Pittman, LLP

(57) ABSTRACT

Disclosed is a method of determining a performance parameter or a parameter derived therefrom, the performance parameter being associated with a performance of a lithographic process for forming one or more structures on a substrate subject to the lithographic process. The method comprises obtaining a probability description distribution comprising a plurality of probability descriptions of the performance parameter, each probability description corresponding to a different position on the substrate and decomposing each probability description into a plurality of component probability descriptions to obtain a plurality of
(Continued)

component probability description distributions. A component across-substrate-area model is determined for each of said plurality of component probability descriptions, which models its respective component probability description across a substrate area; and a value for said performance parameter or parameter derived therefrom is determined based on the component across-substrate-area models.

20 Claims, 4 Drawing Sheets

(56)                    References Cited

U.S. PATENT DOCUMENTS

| 2006/0016561 | A1 | 1/2006 | Choi et al. |
| 2006/0033921 | A1 | 2/2006 | Den Boef et al. |
| 2007/0085991 | A1 | 4/2007 | Liegl et al. |
| 2010/0201963 | A1 | 8/2010 | Cramer et al. |
| 2010/0214550 | A1 | 8/2010 | Hulsebos et al. |
| 2010/0328655 | A1 | 12/2010 | Den Boef et al. |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2011/0102753 | A1 | 5/2011 | Van De Kerkhof et al. |
| 2012/0008127 | A1 | 1/2012 | Tel et al. |
| 2012/0044470 | A1 | 2/2012 | Smilde et al. |
| 2012/0123581 | A1 | 5/2012 | Smilde et al. |
| 2013/0258310 | A1 | 10/2013 | Smilde et al. |
| 2013/0271740 | A1 | 10/2013 | Quintanilha |
| 2016/0033879 | A1* | 2/2016 | Raghunathan ...... G03F 7/70641 |
| | | | 355/55 |
| 2016/0246185 | A1* | 8/2016 | Ypma ................... G03F 7/70508 |
| 2017/0010541 | A1* | 1/2017 | Mossavat ........... G03F 7/70591 |
| 2018/0307216 | A1* | 10/2018 | Ypma ................. G03F 7/70525 |
| 2019/0317412 | A1* | 10/2019 | Mos .................... G03F 7/70616 |
| 2020/0264522 | A1* | 8/2020 | De Winter .......... G03F 7/70641 |

FOREIGN PATENT DOCUMENTS

| TW | 202028882 | 8/2020 |
| WO | 2011081645 | 7/2011 |
| WO | 2013178422 | 12/2013 |
| WO | 2015101458 | 7/2015 |
| WO | 2017186483 | 11/2017 |
| WO | 2018233947 | 12/2018 |
| WO | 2020094286 | 5/2020 |
| WO | 2020200635 | 10/2020 |
| WO | 2021058268 | 4/2021 |

OTHER PUBLICATIONS

Office Action issued in corresponding Taiwanese Patent Application No. 111101236, dated Jan. 13, 2023.
A. Charley et al., "Advanced CD-SEM solution for edge placement error characterization of BEOL pitch 32nm metal layers", Proc. SPIE, vol. 10585 (2018).

* cited by examiner $CO_{L1}$

L1

$CO_{STL1}$ $CO_{ref1}$

CL $H_{L1}$ $CO_{L2}$

L2

$CO_{STL2}$ $CO_{ref2}$

CL $H_{L2}$

METROLOGY METHODS AND APPARATUSES FOR LITHOGRAPHIC PERFORMANCE PARAMETER EVALUATION USING PROBABILITY DESCRIPTIONS

CROSS-REFERENCE TO RELATED APPLICATIONS

This application is the U.S. national phase entry of PCT Patent Application No. PCT/EP2021/087611 which was filed on Dec. 23, 2021, which claims priority of European Patent Application No. 21154358.2 which was filed on Jan. 29, 2021 and which is incorporated herein in its entirety by reference.

FIELD OF THE INVENTION

The present invention relates to a metrology apparatus and methods usable, for example, to perform metrology in the manufacture of devices by lithographic techniques. The invention further relates to such methods for monitoring stochastic effects in a lithographic process.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Today's patterning performance may be characterized by edge placement errors (EPE). The position error of the edge of a feature is determined by the features lateral position error (Overlay, pattern shift) and the error in size of the feature (CD error). Part of the feature dimension and position errors is very local and stochastic in nature; e.g., dependent on local placement errors relating to local overlay (LOVL), local CD uniformity (LCDU), Line Edge Roughness (LER) and line width roughness (LWR). All of these may be important contributors to the EPE performance.

Due to the local and stochastic nature of the EPE metric measuring EPE, and in particular across the wafer, is very metrology intensive. It would be desirable to reduce the metrology effort required for effective EPE monitoring.

SUMMARY OF THE INVENTION

The invention in a first aspect provides a method of determining a performance parameter or a parameter derived therefrom, said performance parameter being associated with a performance of a lithographic process for forming one or more structures on a substrate subject to the lithographic process, the method comprising: obtaining a probability description distribution comprising a plurality of probability descriptions of the performance parameter, each probability description corresponding to a different position on the substrate; decomposing each probability description into a plurality of component probability descriptions to obtain a plurality of component probability description distributions; determining a component across-substrate-area model for each of said plurality of component probability descriptions, which models its respective component probability description across a substrate area; and determining a value for said performance parameter and/or parameter derived therefrom based on the component across-substrate-area models.

The invention in a second aspect provides a method of determining a stochastic performance parameter, said stochastic performance parameter being associated with a relative position of at least two of said structure features relating to one or more structures on a substrate resulting from a lithographic process, the method comprising: obtaining a first probability description of the performance parameter relating to a first structure feature and a second probability description of the performance parameter relating to a second structure feature; and determining a convolution probability distribution description from a convolution of the first probability description and the second probability description.

The invention yet further provides a computer program product comprising machine-readable instructions for causing a processor to perform the method of the first or second aspect, and associated metrology apparatus and lithographic system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figures 1, 2:
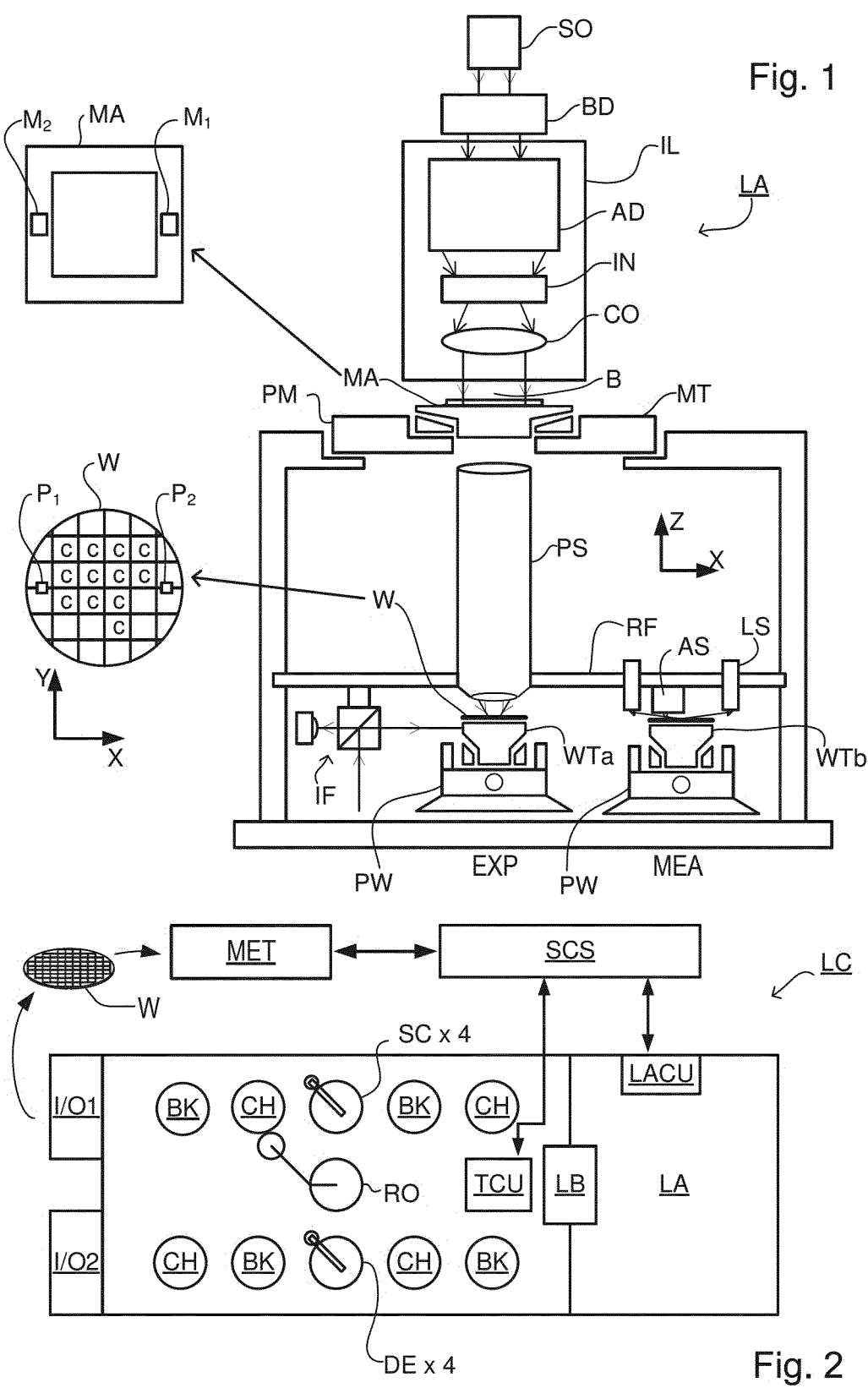
FIG. 1 depicts a lithographic apparatus.
FIG. 2 depicts a lithographic cell or cluster in which an inspection apparatus according to the present invention may be used.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms; the patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks) Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Position errors may occur due to an overlay error (often referred to as "overlay"). The overlay is the error in placing a first feature during a first exposure relative to a second feature during a second exposure. The lithographic apparatus minimizes the overlay errors by aligning each substrate accurately to a reference prior to patterning. This is done by measuring positions of alignment marks on the substrate using an alignment sensor. More information on the alignment procedure can be found in U.S. Patent Application Publication No. US 2010-0214550, which is incorporated herein in its entirety by reference. Pattern dimensioning (e.g., CD) errors may, for example, occur when the substrate is not positioned correctly with respect to a focal plane of the lithographic apparatus. These focal position errors may be associated with un-flatness of a substrate surface. The lithographic apparatus aims to minimize these focal positon errors by measuring the substrate surface topography prior to patterning using a level sensor. Substrate height corrections are applied during subsequent patterning to help assure correct imaging (focusing) of the patterning device onto the substrate. More information on the level sensor system can be found in U.S. Patent Application Publication No. US 2007-0085991, which is incorporated herein in its entirety by reference.

Besides the lithographic apparatus LA and the metrology apparatus MT, one or more other processing apparatuses may be used during device production as well. An etching station (not shown) processes the substrates after exposure of the pattern into the resist. The etch station transfers the pattern from the resist into one or more layers underlying the resist layer. Typically etching is based on application of a plasma medium. One or more local etching characteristics may e.g. be controlled using temperature control of the substrate or directing the plasma medium using a voltage controlled ring. More information on etching control can be found in PCT Patent Application Publication No. WO 2011-081645 and U.S. Patent Application Publication No. US 2006-016561, which are incorporated herein in their entireties by reference.

During the manufacturing of devices, it is desired that the process conditions for processing substrates using one or more processing apparatuses such as the lithographic apparatus or etching station remain stable such that properties of the features remain within certain control limits. Stability of the process is of particular significance for features of the functional parts of an electric device such as an IC, also referred to as product features. To help ensure stable processing, process control capabilities should be in place. Process control involves monitoring of processing data and implementation of means for process correction, e.g. control a processing apparatus based on one or more characteristics of the processing data. Process control may be based on periodic measurement by the metrology apparatus MT, often referred to as "Advanced Process Control" (further also referenced to as APC). More information on APC can be found in U.S. Patent Application Publication No. US 2012-008127, which is incorporated herein in its entirety by reference. A typical APC implementation involves periodic measurements on metrology features on the substrates to monitor and correct drifts associated with one or more processing apparatuses.

Edge placement error EPE is a composed metric comprising contributions associated with overlay and local placement errors from product structures across multiple layers. To measure the local placement errors, metrology may be performed directly on the product structure. This can be done using a scanning electron microscope (SEM) such as an e-beam metrology apparatus for example. To obtain a dense EPE fingerprint across wafer, a very large metrology effort is presently required, comprising measurement of many feature instances at many locations on the wafer. More specifically, local effects are typically related to stochastic effects and hence require massive metrology to characterize the stochastic variation via e.g., a histogram. Global contributors (CDU/Overlay) are more related to more systematic effects as they relate to, for example, to processing tool fingerprints which are not stochastic in nature.

To illustrate this, one formulation of EPE is:

$$EPE = \mu_{EPE} + 3\sigma_{EPE} =$$

$$\frac{HR_{OPC}}{2} + \frac{3\sigma_{PBA}}{2} + \frac{6\sigma_{Local}}{\sqrt{2}} + \sqrt{(3\sigma_{overlay})^2 + (\frac{3\sigma_{CDU\_L}}{2})^2}$$

where $\sigma_{EPE}$, $\sigma_{overlay}$, $\sigma_{PBA}$, $\sigma_{CDU\_L}$, $\sigma_{local}$ represent the standard deviation of respectively EPE, overlay, proximity bias average, line CDU and local errors due to resist and photon stochastics (which mainly affect line width roughness LWR); $\mu_{EPE}$ is the mean of the EPE; and $HR_{OPC}$ is the half-range of the CD error due to optical proximity residuals.

For example, to characterize the local placement errors, histograms can be created by stacking contours of e-beam images of multiple features along a cut line of choice. For a full wafer/field/die fingerprint, a very large number of samples are needed which requires a very large measurement time. Each histogram may, for example, relate to a single field of view (or combined multiple fields of view) of a metrology tool (e.g., e-beam tool) and may comprise measurements from one or multiple wafers. Where the measurements relate to multiple wafers, the measurement data may be sorted according to wafer position, to obtain a histogram per wafer position.

To address this, methods will be described which greatly reduces the metrology effort required for obtaining an across-wafer EPE description. A proposed method comprises a modeling method which models one or more distribution parameters representing a probability density function (pdf) describing a performance parameter distribution over a wafer area (e.g., whole wafer or portion thereof, such as field or die).

Such a method may comprise obtaining a plurality of probability descriptions (e.g., pdfs) of a performance parameter distributed over a wafer area (e.g., such that each probability description relates to a different location within the wafer area); mapping each of the probability descriptions into a plurality of component probability descriptions (e.g., component pdfs); determining a model or fingerprint across the wafer area of one or more distribution parameters representing at least one out of the plurality of component probability descriptions; and determining a value for the performance parameter based on the fingerprint. The wafer area may be the whole wafer or a portion thereof.

In a specific embodiment, the performance parameter may relate to local placement of a feature or relative local placement of first and second features. In the latter case, the probability description at each wafer location may comprise a convolution pdf determined from a convolution of a first pdf of a position parameter for the first feature and a second pdf of a position parameter for the second feature.

To achieve this, also disclosed is a method of determining a convolution probability density function (pdf) representing a distribution of a relative position error between a first feature and a second feature on a substrate. The method comprises obtaining a first pdf and a second pdf associated with respectively a first distribution of a position parameter (e.g., an edge position) of the first feature and a second distribution of the position parameter of the second feature; and convolving the first pdf with the second pdf to obtain the convolution pdf.

Figure 3:
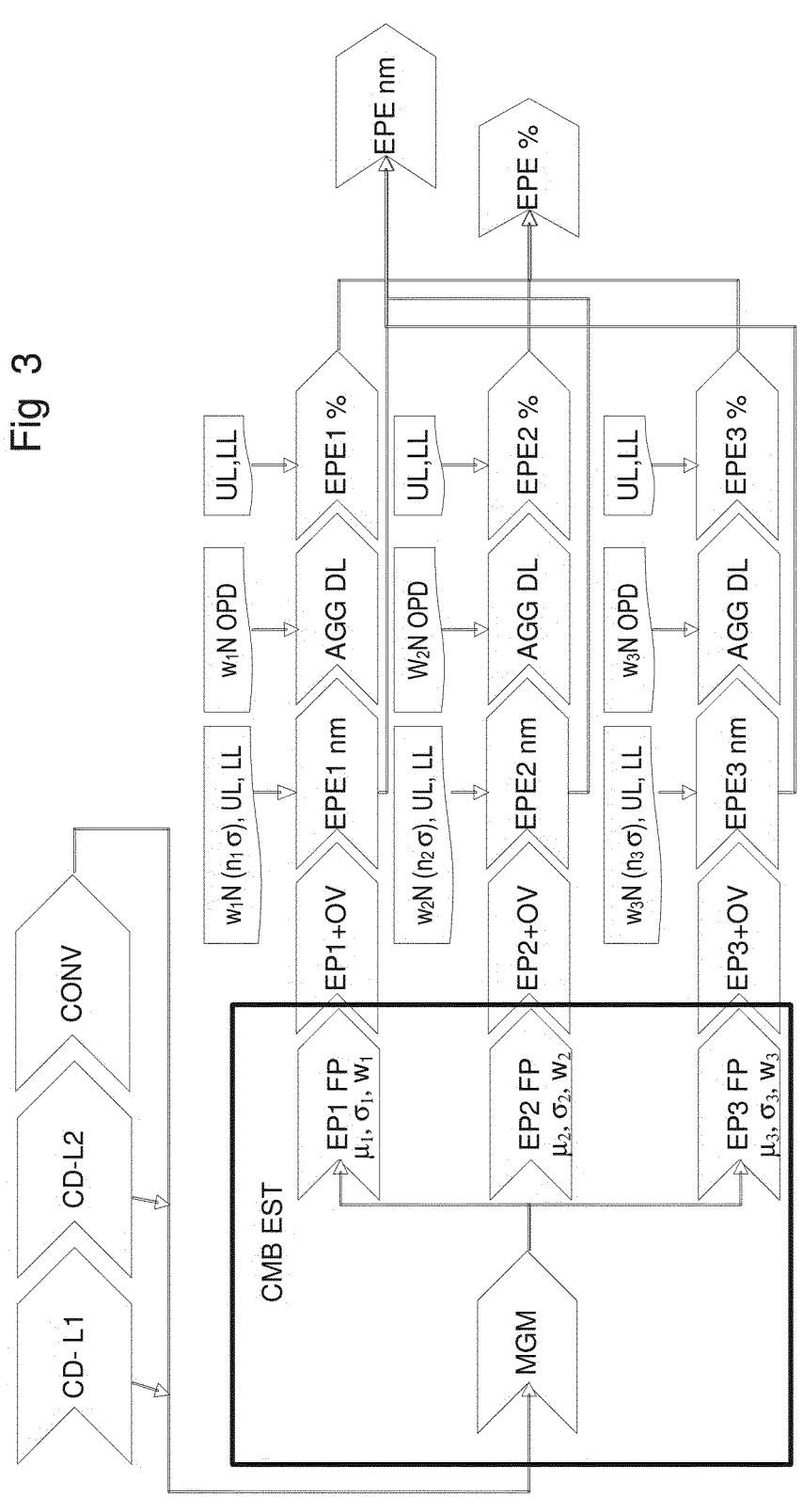
FIG. 3 is a flowchart of a method for modeling a local placement distribution according to an embodiment of the invention.

FIG. 3 is a flowchart of a method for modelling one or more distribution parameters. First contour data CD-L1 and second contour data CD-L2 is used to determine a convolved contour pdf CONY. The first contour data CD-L1 may comprise a distribution (spatially distributed over a wafer or portion thereof) of first probability descriptions (e.g., first pdfs or first histograms from which first pdfs may be derived) of stacked contours relating to a first layer and/or first feature L1 and the second contour data CD-L2 may comprise a distribution (spatially distributed over a wafer or portion thereof) of second probability descriptions (e.g., second pdfs or second histograms from which pdfs may be derived) of stacked contours relating to a second layer and/or second feature L2. Where the first contour data CD-L1 and second contour data CD-L2 comprise histogram distributions, these steps may comprise converting them into pdf distributions, for example.

Figure 4:
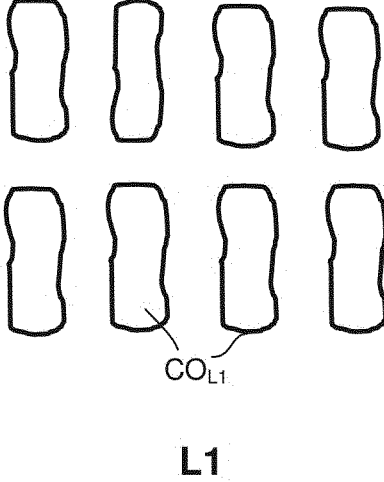
FIG. 4 illustrates a contour stacking method for determining probability descriptions such as histograms for two features, according to an embodiment of the invention.
Figure 4:
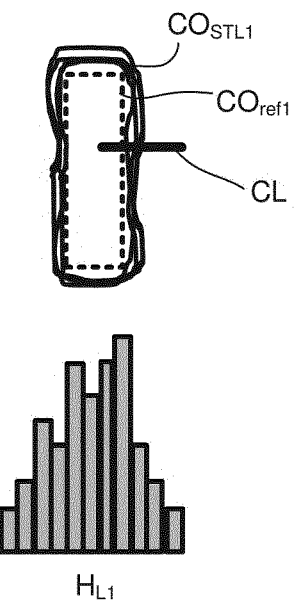
Figure 4:
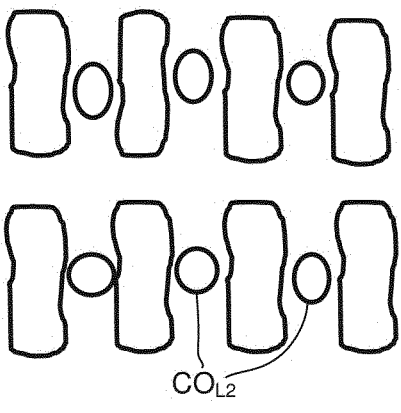
Figure 4:
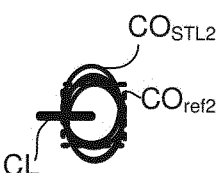
Figure 4:
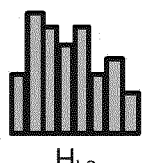
Figures 5, 6:
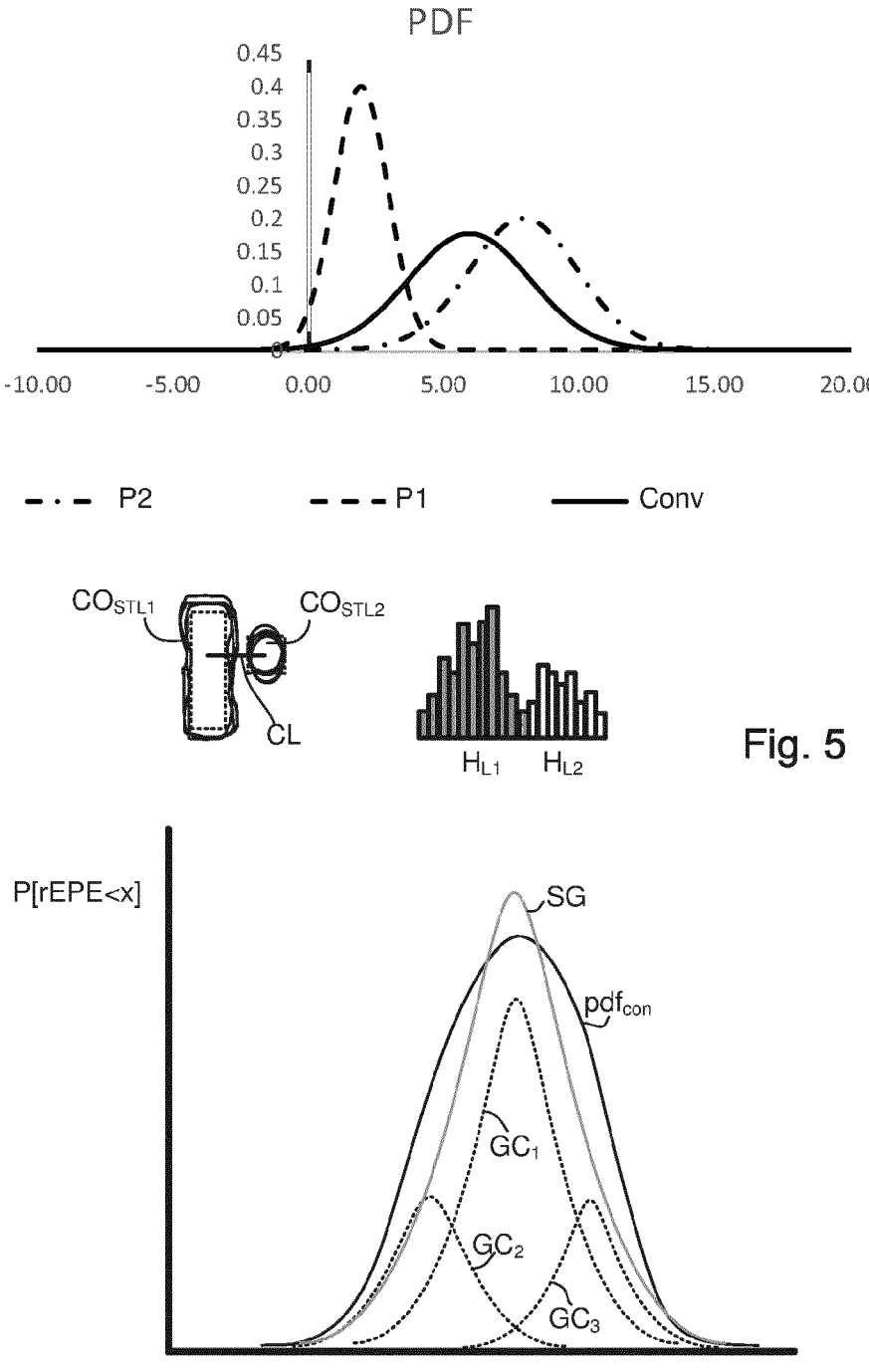
FIG. 5 illustrates a method for determining a convolved pdf according to an embodiment of the invention.
FIG. 6 illustrates a method for determining multiple Gaussian components from a probability representation distribution according to an embodiment of the invention.

In a next step CONY, a convolution distribution is determined, which comprises (per wafer position) a convolution of the first pdf and the second pdf. This convolution distribution may describe a distribution of a relative contour position error between two features (e.g., in two layers or otherwise) along a cutline, over a plurality of positions on a wafer. FIGS. 4 and 5 help illustrate these first three steps.

Contour variability or overlay margin (local placement error) variability may be determined by contour stacking, which is described in PCT publication WO2020094286A1 (incorporated herein by reference). A method may comprise obtaining one or more images of parts of a substrate on each of a plurality of layers of the substrate. The images, relating to one or more corresponding images of the same feature in different layers of a substrate and/or images of a plurality of features on the same layer of a substrate, may be stacked (e.g. aligned and overlaid). The alignment process may be based on aligning the images in dependence on one or more reference positions in, or superimposed onto, each of the images so that there is no overlay error between the images. For example, the alignment process may comprise aligning the target designs of the features in the images so that there is no overlay error between the target designs. The alignment process may be based on aligning the images in dependence on intended design data (e.g., gds data). The effect of performing the alignment process is to remove the effects of any overlay error between the different images.

The overlay margin is a measure of the stochastic variation of features in the stack of aligned images. The overlay margin may be calculated in dependence on the differences between the contours of corresponding features in the aligned versions of the images. The overlay margin may also be calculated in dependence on the target contours for the features. For example, for each of the images, the overlay margin may be calculated in dependence on a comparison of the feature in the image with the target of the feature. The differences between the contours of features in an image and the contours of features in other images, as well as target contours for the features, can be determined by a plurality of well-known specific image-related metrics, such as critical dimension uniformity (CDU), line width roughness (LWR), critical dimension amplitude and placement errors.

Overlay margin is related to EPE. EPE is an image-metric that provides an overall representation of the differences between the contours of one or more images of features and a target contours for the features. EPE includes the overlay error between the images of features and the target contours for the features. Overlay margin differs from EPE in that it does not include the overlay error between images of the feature because the overlay error is removed by the above-described alignment process: e.g., Overlay Margin=EPE–Overlay Error.

FIG. 4 shows a repeated instance of a first feature in a first layer L1, each instance comprising (unintentionally) a different contour $CO_{L1}$. Also shown is all of these contours being stacked $CO_{STL1}$ with respect to a reference contour $CO_{ref1}$ which may comprise an intended contour (e.g., according to a .gds file). FIG. 4 also shows a repeated instance of a second feature in a second layer L2, each instance comprising (unintentionally) a different contour $CO_{L2}$. Also shown is all of these contours being stacked $CO_{STL2}$ with respect to a reference contour $CO_{ref2}$ which again may comprise an intended contour. In each case, the contour variation or distribution may be represented (e.g., at any cutline CL) by a histogram; here the first stacked contours $CO_{STL1}$ is represented by histogram H u and the second stacked contours $CO_{STL2}$ is represented by histogram $H_{L2}$.

FIG. 5 shows (bottom) the stacked contours $CO_{STL1}$, $CO_{STL2}$ in their relative positions on a wafer and the corresponding histograms $H_{L1}$, $H_{L2}$. Above this, FIG. 5 shows a plot of the associated pdfs. A first plot P1 is the pdf describing the contour (edge) position at cutline CL for the first feature (e.g., in a first layer) and a second plot P2 is the pdf describing the contour (edge) position at cutline CL for the second feature (e.g., in a second layer). The third plot Cony is the convolution pdf of the first and second pdfs, and relates to the overlay margin or relative local edge placement between the two features.

The EPE overlay margin may be computed as the probability density of the difference of random variables Z=R–L:

$$p(z) = \frac{d}{dz}P(Z \le z) = \sum_{l=1}^{N} p_l(l) \cdot p_r(z+l)\Delta_l$$

Where:
  $p_l$ the probability density histogram of the left edge (first feature or layer 1 feature)
  $p_r$ the probability density histogram of the right edge (second feature or layer 2 feature)
  l is the bin number of the left histogram.
  $\Delta_l$ is the bin width of the left histogram.
  z is the bin number of the right histogram and overlay margin histogram.

In this manner, local placement between multiple features and/or multiple patterned layers may be determined by a convolution of contour histograms or pdfs (i.e., probability representations) of stacked contours measured in different layers along a cut line (or a 2D surface or 3D volume) of choice.

Returning to FIG. 3, the convolution probability representation distribution may be decomposed into multiple Gaussian components (per wafer position) or multi Gaussian model MGM. Each Gaussian component may be described and/or parameterized by its mean μ, sigma or deviation σ and height or weight w and may be associated with a specific cause.

FIG. 6 illustrates this decomposition step MGM. The convolution pdf $pdf_{con}$ may decomposed into multiple (three in this example) Gaussian components $GC_1$, $GC_2$, $GC_3$ (where a combination of these components comprises the convolution pdf or very close approximation thereof). For reference a best single component Gaussian representation SG to the convolution pdf $pdf_{con}$ also shown.

Referring back to FIG. 3, component across-substrate-area models or component fingerprints for each parameter EP1 FP, EP2 FP, EP3 FP are determined respectively per Gaussian component $GC_1$, $GC_2$, $GC_3$. This may comprise estimating the wafer fingerprint in terms of mean, sigma and weight for each Gaussian component distribution. Alternatively (as indicated by box CMB EST) this step may be integrated with the decomposition step such that each component parameter is allowed to vary across the wafer area. For example, a combined optimization of the component parameters and component fingerprints may use a combined maximum likelihood optimization approach. With these modelled component fingerprints, a local placement error distribution model can be evaluated at any point on the wafer, per Gaussian contributor.

Optionally each component may be combined EP1+OV, EP2+OV, EP3+OV with overlay (common grid), to obtain an EPE component fingerprint EPE1 nm, EPE2 nm, EPE 3 nm (e.g., nanometer scale EPE magnitude fingerprints). Each Gaussian component represents the product of the Gaussian weight and the number of measurements N in the histogram ($w_1N$, $w_2N$, $w_3N$). Therefore the failure rate for each Gaussian component will be $1{:}w_1N$, $1{:}w_2N$, $1{:}w_3N$, which relates to an n-sigma value, respectively $n_1\sigma$, $n_2\sigma$, $n_3\sigma$. This n-sigma value can be used to express the EPE component (e.g., in nm units) in a wafer map as:

$$EPE_{IL}=(\mu_i - n_i\sigma_i)$$

$$EPE_{IR}=(\mu_i + n_i\sigma_i)$$

where the i index describes the Gaussian component number (e.g., i=1 to 3 in this example), and the L, R notation is as described above. The value for n may be chosen, for example, based on a process window or upper and lower limits UL, LL.

Following this, the per component EPE fingerprints may be aggregated (occurrences per die OPD) to a die level map AGG DL to obtain an EPE component capability or yield fingerprint EPE1%, EPE2%, EPE 3% describing the percentage chance of yielding per component, based on the occurrences per die. This EPE capability/yield map may be obtained from applying limits UL, LL to the equivalent cdf (cumulative distribution function) for each component, to determine a probability e.g., described in terms of a percentage.

A scaling factor for $\sigma$ and an offset for the mean may be used to match the capability/yield map to a yield reference map (e.g. Voltage Contrast proxy). The scaling factors may be fitted such that probability matches the reference probability curve of a yield proxy The EPE component fingerprints EPE1 nm, EPE2 nm, EPE 3 nm may be combined to obtain a total EPE fingerprint EPE nm and/or EPE component yield fingerprints EPE1%, EPE2%, EPE 3% may be combined to obtain a total yield fingerprint EPE %.

By decomposing the observed distribution into Gaussian components, it becomes possible to derive a simple (e.g., mean, sigma, weight) distribution parameterization to model the performance parameter across the wafer. This allows a simple fit to these parameters so as to deduce the expected observed distribution at any location of the wafer. Such an approach benefits from the simple nature of Gaussian statistics (for example simple linear addition of individual variances). For example, this makes it simpler to aggregate distributions across a particular wafer portion (e.g., a die) to obtain an aggregated probability of said wafer portion having an EPE associated with a device failure.

By such a method, extensive metrology only needs to be performed for relatively few positions resulting in a much lower metrology cost. An additional advantage is that the stochastic data (contour data) and overlay data which is combined to calculate the EPE fingerprint does not require measurement according to same sampling scheme.

The convoluted histograms or pdfs of multiple layers provide the correct distribution for EPE, which is not true of present methods such as those which rely on edge distance metrics. The multiple Gaussian model brings extendibility for multimodal effects in layer processing. Furthermore, as the EPE will be known for each Gaussian contributor, it may be linked to various types of local placement contributors in the patterning process.

It should be appreciated that the multiple Gaussian distribution model approach disclosed herein may be applied to modeling of any suitable parameter of interest (e.g., overlay, focus CD, placement) to improve fingerprint estimates for that parameter. Such an approach may be used to model, in addition to EPE fingerprints as described, overlay fingerprints, focus fingerprints, CD fingerprints or single layer edge placement measurements. In such embodiment, it may be that no convolution step is required (as the parameter being modeled relates to a single feature rather than a relative position, for example).

To summarize, the multiple Gaussian distribution model approach disclosed herein may provide a better estimate for EPE as a yield proxy across the wafer using limited (e.g., e-beam based) local EPE measurement. The proposed may be based on the fact that an observed distribution of edge placement (error) at a particular measurement location is intrinsically linked to a plurality of causes, each cause being characterized by its specific Gaussian distribution.

Further embodiments of the disclosure are summarized in the list of numbered clauses below:

1. A method of determining a performance parameter or a parameter derived therefrom, said performance parameter being associated with a performance of a lithographic process for forming one or more structures on a substrate subject to the lithographic process, the method comprising: obtaining a probability description distribution comprising a plurality of probability descriptions of the performance parameter, each probability description corresponding to a different position on the substrate; decomposing each probability description into a plurality of component probability descriptions to obtain a plurality of component probability description distributions; determining a component across-substrate-area model for each of said plurality of component probability descriptions, which models its respective component probability description across a substrate area; and determining a value for said performance parameter or parameter derived therefrom based on the component across-substrate-area models.

2. A method according to clause 1, wherein said decomposing step comprises decomposing each of said probability descriptions into a plurality of Gaussian component probability descriptions to obtain a plurality of Gaussian component probability description distributions.

3. A method according to clause 2, wherein each of said Gaussian component probability descriptions and each of said component across-substrate-area models are parameterized by its mean, deviation and weight.

4. A method according to clause 3, wherein determining each of said component across-substrate-area models comprises estimating a respective substrate area fingerprint in terms of mean, deviation and weight for each Gaussian component probability description distribution.

5. A method according to any preceding clause, wherein said decomposing step and said determining a component across-substrate-area model step are performed as a single optimization.

6. A method according to any preceding clause, wherein said performance parameter is associated with a position of said one or more structures on a substrate.

7. A method according to clause 6, wherein said performance parameter is associated with a local position of one or more structure features relating to said one or more structures.

8. A method according to clause 7, comprising performing a contour stacking step to determine a stochastic variation of said local position over multiple instances of each of said one or more structure features with respect to a reference position.

9. A method according to clause 7 or 8, wherein said local position of one or more structure features comprises one or more edge positions.

10. A method according to clause 7, 8 or 9, wherein said plurality of probability descriptions each relate to a relative position of at least two of said structure features.

11. A method according to clause 10, wherein said plurality of probability descriptions each comprise a convolution probability description, and said method comprises determining each said convolution probability description from a convolution of a first probability description relating to the position of a first structure feature and a second probability description relating to the position of a second structure feature.

12. A method according to clause 11, wherein said convolution probability description is defined for a difference over first random variables within said first probability description and second random variables within said second probability description.

13. A method according to clause 11 or 12, wherein said first structure feature and second structure feature relate respectively to a first structure and a second structure, said second structure being adjacent said first structure.

14. A method according to clause 13, wherein said first structure is in a first layer and said second structure is in a second layer.

15. A method according to clause 11 or 12, wherein said first structure feature and second structure feature relate to a single structure or a first structure and a second structure in a single layer.

16. A method according to any of clauses 7 to 15, comprising combining each of said component across-substrate-area models with an overlay model to determined respective component edge placement error models.

17. A method according to any of clauses 1 to 6, wherein said performance parameter comprises critical dimension of said one or more structures or focus during exposure of said one or more structures.

18. A method according to any preceding clause, comprising aggregating to a die level each of said component across-substrate-area models, and combining the resultant component die-level models to obtain a yield model which describes a probability of whether each die will yield.

19. A method according to any preceding clause, comprising combining the component across-substrate-area models or component models derived therefrom to determine a combined across-substrate-area model.

20. A method according to clause 19, wherein said step of determining a value for said performance parameter and/or parameter derived therefrom is determined using said combined across-substrate-area model.

21. A method according to any preceding clause, wherein said probability descriptions and component probability descriptions each comprise a probability density function.

22. A method according to any preceding clause, comprising determining a specific root cause relating to one or more of said component probability descriptions.

23. A method according to any preceding clause, wherein said substrate area comprises the full substrate area.

24. A method of determining a stochastic performance parameter, said stochastic performance parameter being associated with a relative position of at least two of said structure features relating to one or more structures on a substrate resulting from a lithographic process, the method comprising: obtaining a first probability description of the performance parameter relating to a first structure feature and a second probability description of the performance parameter relating to a second structure feature; and determining a convolution probability distribution description from a convolution of the first probability description and the second probability description.

25. A method according to clause 24, wherein said convolution probability description is defined for a difference over first random variables within said first probability description and second random variables within said second probability description.

26. A method according to clause 24 or 25, wherein said first structure feature and second structure feature relate respectively to a first structure and a second structure, said second structure being adjacent said first structure.

27. A method according to clause 26, wherein said first structure is in a first layer and said second structure is in a second layer.

28. A method according to clause 24 or 25, wherein said first structure feature and second structure feature relate to a single structure or a first structure and a second structure in a single layer.

29. A method according to any of clauses 24 to 28, wherein said first and second probability descriptions each comprise a probability density function.

30. A computer program comprising processor readable instructions which, when run on suitable processor controlled apparatus, cause the processor controlled apparatus to perform the method of any of clauses 1 to 29.

31. A computer program carrier comprising the computer program of clause 30.

32. A processing apparatus comprising: a processor; and a computer program carrier comprising the computer program of clause 31.

33. A metrology apparatus comprising the processing apparatus of clause 32.

34. A lithographic exposure apparatus comprising the processing apparatus of clause 32.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term target should not be construed to mean only dedicated targets formed for the specific purpose of metrology. The term target should be understood to encompass other structures, including product structures, which have properties suitable for metrology applications.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining a performance parameter or a parameter derived therefrom, the performance parameter being associated with a performance of a lithographic process for forming one or more structures on a substrate subject to the lithographic process, the method comprising:
   obtaining a plurality of probability descriptions of the performance parameter, each probability description corresponding to a different position on the substrate;
   decomposing each probability description into a plurality of component probability descriptions to obtain a plurality of component probability description distributions;
   determining, using a hardware computer system, a component across-substrate-area model for each of the plurality of component probability descriptions, which models its respective component probability description across a substrate area; and
   determining a value for the performance parameter or parameter derived therefrom based on the component across-substrate-area models.

2. The method as claimed in claim 1, wherein the decomposing comprises decomposing each of the probability descriptions into a plurality of Gaussian component probability descriptions to obtain a plurality of Gaussian component probability description distributions.

3. The method as claimed in claim 2, wherein each of the Gaussian component probability descriptions and each of the component across-substrate-area models are parameterized by its mean, deviation and weight.

4. The method as claimed in claim 3, wherein determining each of the component across-substrate-area models comprises estimating a respective substrate area fingerprint in terms of mean, deviation and weight for each Gaussian component probability description distribution.

5. The method as claimed in claim 1, wherein the decomposing and the determining a component across-substrate-area model are performed as a single optimization.

6. The method as claimed in claim 1, wherein the performance parameter is associated with a position of the one or more structures on a substrate.

7. The method as claimed in claim 6, wherein the performance parameter is associated with a local position of one or more structure features relating to the one or more structures.

8. The method as claimed in claim 7, wherein each probability description of the plurality of probability descriptions relates to a relative position of at least two of the one of more structure features.

9. The method as claimed in claim 8, wherein each probability description of the plurality of probability descriptions comprises a convolution probability description, and further comprising determining each convolution probability description from a convolution of a first probability description relating to the position of a first structure feature and a second probability description relating to the position of a second structure feature.

10. The method as claimed in claim 7, further comprising combining each of the component across-substrate-area models with an overlay model to determine respective component edge placement error models.

11. The method as claimed in claim 1, further comprising aggregating to a die level each of the component across-substrate-area models, and combining the resultant component die-level models to obtain a yield model which describes a probability of whether each die will yield.

12. The method as claimed in claim 1, further comprising combining the component across-substrate-area models or component models derived therefrom to determine a combined across-substrate-area model.

13. The method as claimed in claim 12, wherein the determining a value for the performance parameter and/or parameter derived therefrom is determined using the combined across-substrate-area model.

14. The method as claimed in claim 1, wherein the probability descriptions and component probability descriptions each comprise a probability density function.

15. The method as claimed in claim 1, further comprising determining a specific root cause relating to one or more of the component probability descriptions.

16. A non-transitory computer-readable medium having instructions therein configured to, upon execution by at least one processor, cause the at least one processor to at least:
   obtain a plurality of probability descriptions of a performance parameter, each probability description corresponding to a different position on the substrate and the performance parameter being associated with a performance of a lithographic process for forming one or more structures on a substrate subject to the lithographic process;
   decompose each probability description into a plurality of component probability descriptions to obtain a plurality of component probability description distributions;
   determine a component across-substrate-area model for each of the plurality of component probability descriptions, which models its respective component probability description across a substrate area; and determine a value for the performance parameter or parameter derived therefrom based on the component across-substrate-area models.

17. A method of determining a stochastic performance parameter, the stochastic performance parameter being associated with a relative position of at least two structure features relating to one or more structures on a substrate resulting from a lithographic process, the method comprising:

obtaining a first probability description of the performance parameter relating to a first structure feature and a second probability description of the performance parameter relating to a second structure feature; and determining, by a hardware computer system, a convolution probability distribution description from a convolution of the first probability description and the second probability description.

18. The method as claimed in claim 17, wherein the convolution probability description is defined for a difference over first random variables within the first probability description and second random variables within the second probability description.

19. The method as claimed in claim 17, wherein the first structure feature and second structure feature relate respectively to a first structure and a second structure, the second structure being adjacent the first structure.

20. A non-transitory computer-readable medium having instructions therein configured to, upon execution by at least one processor, cause the at least one processor to at least:

obtain a first probability description of a stochastic performance parameter relating to a first structure feature and a second probability description of the performance parameter relating to a second structure feature, the performance parameter being associated with a relative position of at least two structure features relating to one or more structures on a substrate resulting from a lithographic process; and determine a convolution probability distribution description from a convolution of the first probability description and the second probability description.

* * * * *